(12) United States Patent
Lin et al.

(10) Patent No.: US 10,222,843 B1
(45) Date of Patent: Mar. 5, 2019

(54) SERVER PLATFORM THERMAL CONTROL SYSTEM USING COMPONENT POWER

(71) Applicant: ZT Group Int'l, Inc., Secaucus, NJ (US)

(72) Inventors: Ting Yu Lin, Bloomfield, NJ (US); Daniel Ferrone, Lyndhurst, NJ (US); Cheng Chen, East Rutherford, NJ (US); Chuanke Lin, Flushing, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 0 days.

(21) Appl. No.: 15/071,547

(22) Filed: Mar. 16, 2016

(51) Int. Cl.
*G06F 1/20* (2006.01)

(52) U.S. Cl.
CPC ..................................... *G06F 1/20* (2013.01)

(58) Field of Classification Search
CPC . F24F 11/0001; F24F 2011/0038; G06F 1/20; G06F 1/206; H05K 7/20836
See application file for complete search history.

(56) References Cited

U.S. PATENT DOCUMENTS

| | | | | | |
|---|---|---|---|---|---|
| 2004/0257013 | A1* | 12/2004 | Chhleda | .................. | G06F 1/206 318/268 |
| 2008/0302505 | A1* | 12/2008 | Kato | ..................... | F25B 23/006 165/61 |
| 2012/0026686 | A1* | 2/2012 | Suzuki | ................. | F24F 11/0001 361/689 |
| 2015/0378404 | A1* | 12/2015 | Ogawa | .................... | G06F 1/206 700/300 |

* cited by examiner

*Primary Examiner* — Nathan L Laughlin
(74) *Attorney, Agent, or Firm* — Dergosits & Noah LLP; Todd A. Noah (57) ABSTRACT

A system and method for controlling cooling of computer components of a computing device are provided. A measurement of power consumption of at least one of the computer components is received. An amount of heat expected to be generated by the at least one computer components is determined based on the received measurement of power consumption. An output of a cooling system of the computer components is controlled based on the determined amount of heat expected to be generated.

20 Claims, 10 Drawing Sheets

SERVER PLATFORM THERMAL CONTROL SYSTEM USING COMPONENT POWER

BACKGROUND

While computer components (e.g., CPUs, chipsets, graphics cards, hard disk drives, etc.) are designed to generate as little heat as possible, these components nonetheless produce heat during operation and thus require a cooling system to attend to the heat produced. Heat mitigation measures are taken to prevent overheating of components, which may lead to temporary or permanent damage to the components. Computer cooling is required to remove the waste heat produced by the components so that temperatures may be maintained within certain operating limits so as to avoid such damage.

Computers are often equipped with active cooling systems that require energy to cool critical components. These cooling systems can include forced-air devices driven by fans or liquid cooling mechanisms driven by pumps. For example, heatsinks attached to the components may be cooled by airflow induced by computer fans to reduce a rise in temperature. Furthermore, attention to patterns of airflow can also help prevent the development of hotspots. Conventional cooling systems operate in similar fashion to that of a thermostat, where cooling is activated when temperatures are sensed to be rising beyond a certain threshold level. These cooling systems, however, provide an optimization problem for designers striving to minimize the energy required to cool system components. In optimizing cooling systems, a common goal is to minimize thermal margins (i.e., how far the current operating temperature is below the maximum operating temperature of the processor) so that minimal energy is consumed to maintain a allowable temperature, while avoiding temperature excursions in excess of thermal specification temperatures while subjected to dynamic power loadings.

In practice, fans do not always run at constant speed. In fact, most computers have dynamic fan speed control (FSC) algorithms that react to on-board temperature sensors. FSC algorithms can be subject to frequent changes in component power that result in frequent changes in temperature climates, thus exacerbating issues related to cooling of the components. For example, overcooling may occur when fan speeds are too high. While this situation doesn't threaten the performance of the components, overcooling results in wasted cooling power. Overcooling may also produce excessive sound levels from the running fans. In some instances, higher fan speeds have the potential to cause performance degradation in storage devices as a result of rotational vibration. Undercooling may also occur when fan speeds are too low, resulting in critical components exceeding maximum operating temperature limits. Additionally, time delays may result from current dynamic fan speed control algorithms, since changes in fan speed may be too slow to cool a system subjected to rapid changes in power consumption or ambient temperature With the continual increase in computing power from more advanced processors and associated components come the challenges of effectively managing temperature of computer components. Thus, there exists a need for a control system that can more efficiently and more intelligently handle computer cooling.

DETAILED DESCRIPTION

The subject matter discloses a server platform thermal control system that controls computer cooling based on measurements of power consumption of computer components. In an embodiment, the measurement of power consumption of at least one of the computer components may be received, and an output of a cooling system of the computer components may be controlled based on the received measurement. Examples of components from which power consumption measurements are received include but are not limited to the central processing unit (CPU), an in-line memory module (e.g., a dual in-line memory module), a storage drive (e.g., a hard drive), and a peripheral component interconnect express (PCIe) card.

In an embodiment, temperature readings from one or more of the computer components may also be received. Based on the received temperature readings and corresponding maximum operating temperature values associated with the components, thermal margins may be calculated. In some embodiments, the output of the cooling system may further be controlled based on the received temperature readings from the computer components and the calculated thermal margins. For example, in order to minimize the amount of power consumed, the cooling system may be configured to minimize thermal margin values while ensuring that component temperatures do not exceed maximum allowable temperatures during dynamic power loadings. In an embodiment, ambient temperature readings may also be received from one or more zones of the computing device. Ambient temperature readings provide yet another input that the cooling system may use to determine how best to control the output of the cooling system of the computer components.

In some embodiments, the power consumption of the computer components may be read by one of firmware, an external measurement device, and a mathematical derivation. Likewise, component temperature as well as ambient temperature may be read by firmware or external measurement devices. Furthermore, while the discussion below relate primarily to forced air cooling systems using fans, the same concepts may be applied to liquid cooling systems using water pumps as well.

Prior to describing the subject matter in detail, an exemplary hardware system in which the subject matter may be implemented is described. Those of ordinary skill in the art will appreciate that the elements illustrated in FIG. 1 may vary depending on the system implementation.

Figure 1:
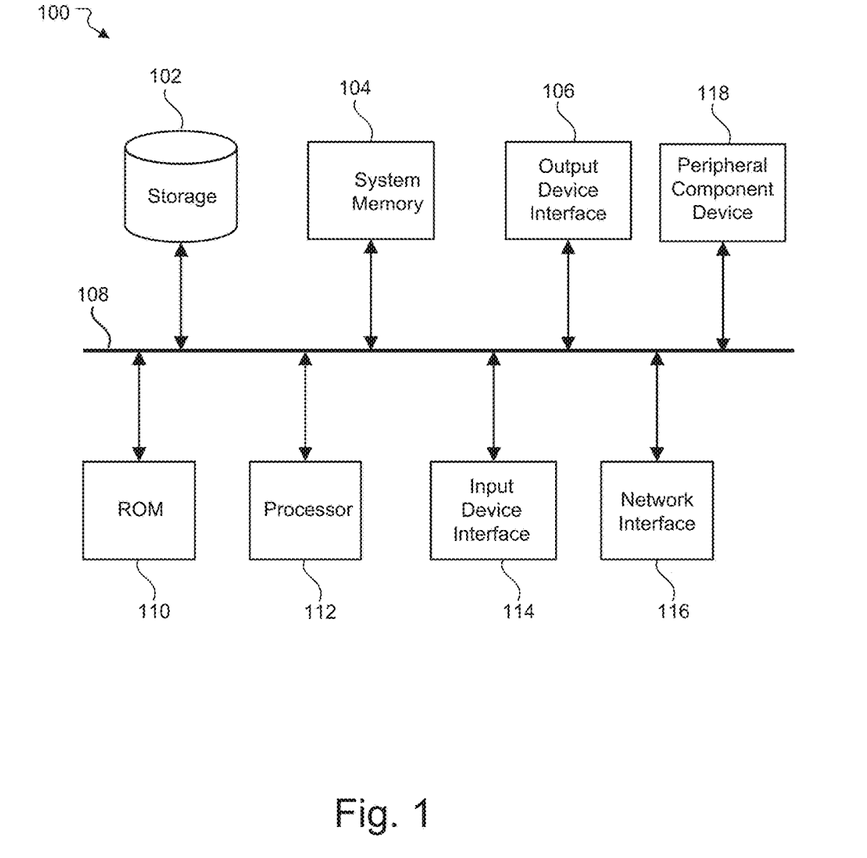
FIG. 1 conceptually illustrates an example electronic system with which some implementations of the subject technology are implemented.

FIG. 1 conceptually illustrates an example electronic system 100 with which some implementations of the subject technology are implemented. Electronic system 100 can be a computer, a server or any other sort of electronic device that include components that have heat generation properties. Such an electronic system includes various types of computer readable media and interfaces for various other types of computer readable media. Electronic system 100 includes a bus 108, processing unit(s) 112, a system memory 104, a read-only memory (ROM) 110, a permanent storage device 102, an input device interface 114, an output device interface 106, a network interface 116 and peripheral component device(s) 118.

Bus 108 collectively represents all system, peripheral, and chipset buses that communicatively connect the numerous internal devices of electronic system 100. For instance, bus 108 communicatively connects processing unit(s) 112 with ROM 110, system memory 104, permanent storage device 102 and peripheral component device(s) 118. In an embodiment, processing unit(s) 112 may be the central processing unit (CPU), and system memory 104 may be a dual in-line memory module (DIMM). Furthermore, peripheral component device(s) 118 may be connected to bus 108 via a peripheral component interconnect express (PCIe) card (not shown).

From these various memory units, processing unit(s) 112 retrieves instructions to execute the processes of the subject disclosure (i.e., control of the component cooling system). The processing unit(s) can be a single processor or a multi-core processor in different implementations.

ROM 110 stores static data and instructions that are needed by processing unit(s) 112 and other modules of the electronic system. Permanent storage device 102, on the other hand, is a read-and-write memory device. This device is a non-volatile memory unit that stores instructions and data even when electronic system 100 is off. Some implementations of the subject disclosure use a mass-storage device (such as a magnetic, solid state, or optical disk and its corresponding disk drive) as permanent storage device 102.

Other implementations use a removable storage device (such as a floppy disk, flash drive, and its corresponding disk drive) as permanent storage device 102. Like permanent storage device 102, system memory 104 is a read-and-write memory device. However, unlike storage device 102, system memory 104 is a volatile read-and-write memory, such as random access memory. System memory 104 stores some of the instructions and data that the processor needs at runtime. In some implementations, the processes of the subject disclosure are stored in system memory 104, permanent storage device 102, and/or ROM 110. For example, the various memory units include instructions for determining an output of a computer component cooling system. From these various memory units, processing unit(s) 112 retrieves instructions to execute and data to process in order to execute the processes of some implementations.

Bus 108 also connects to input and output device interfaces 114 and 106. Input device interface 114 enables the user to communicate information and select commands to the electronic system. Input devices used with input device interface 114 include, for example, alphanumeric keyboards and pointing devices (also called "cursor control devices"). Output device interface 106 enables, for example, the display of images generated by the electronic system 100. Output devices used with output device interface 106 include, for example, printers and display devices, such as cathode ray tubes (CRT) or liquid crystal displays (LCD). Some implementations include devices such as a touchscreen that functions as both input and output devices.

Finally, as shown in FIG. 1, bus 108 also couples electronic system 100 to a network (not shown) through a network interface 116. In this manner, the computer can be a part of a network of computers, such as a local area network, a wide area network, or an Intranet, or a network of networks, such as the Internet. Any or all components of electronic system 100 can be used in conjunction with the subject disclosure.

Figure 2:
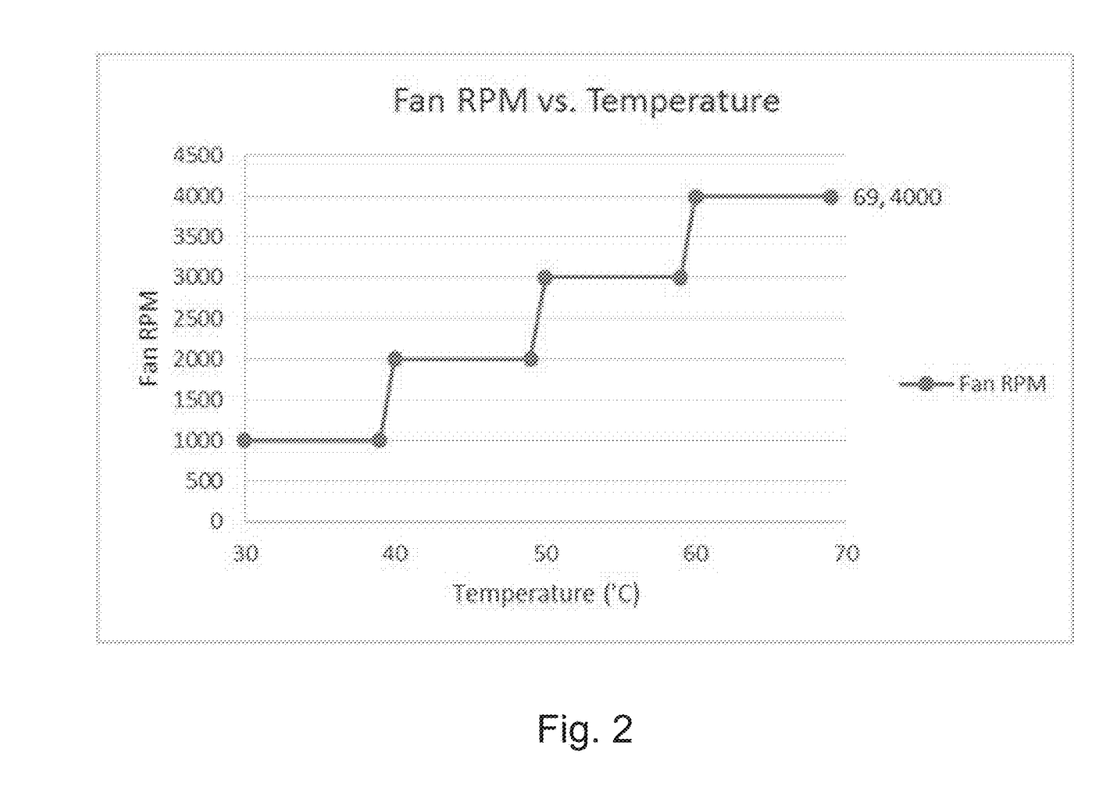
FIG. 2 provides a graph representing a conventional computer cooling control system.

FIG. 2 provides a graph representing a conventional computer cooling control system. Conventional computer cooling systems use some combination of component temperature, temperature margin and temperature sensor reading to control fan speed. Fan speed can be determined as fan revolutions per minute (RPM), a percentage of maximum RPM, or PWM. As shown in FIG. 2, temperature rises along the x-axis results in the computer cooling control system stepping up fan RPM to compensate for the heat generated. In this example, when component temperature rises to 40° C., the fan speed is stepped from 1000 RPM to 2000 RPM. Each subsequent 10° C. increase in temperature further steps up fan speed an additional 1000 RPM.

In practice, frequent changes in temperature climates expose certain shortcomings of the conventional computer cooling control system. In some cases, overcooling may occur when there is a temporary spike in temperature, and fan speeds are adjusted to run too high to compensate. This overcooling results in wasted power as well as potentially excessive sound levels generated by the running fans. Running fans at higher speeds for long durations also has potential to cause performance degradation in storage devices as a result of rotational vibration. In other cases, undercooling may also occur when fan speeds are increased too slowly to account for a sharp rise temperatures. Undercooling may result in critical components exceeding maximum operating temperature limits.

Figure 3:
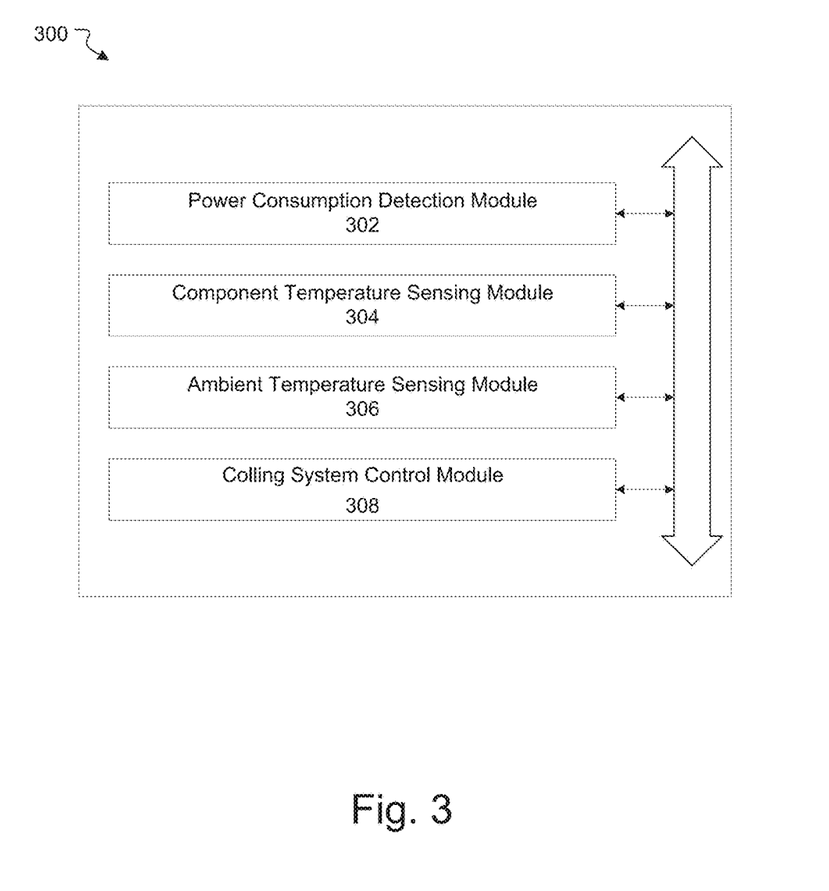
FIG. 3 illustrates an example system for controlling a computer cooling system.

To address such deficiencies, a control system that can more efficiently and more intelligently handle computer cooling may be used. FIG. 3 illustrates an example system for intelligent control of a computer cooling system. System 300 includes power consumption detection module 302, component temperature sensing module 304, ambient temperature sensing module 306, and cooling system control module 308. These modules, which are in communication with one another, process information retrieved from components connected to bus 108 such as system memory 104, processing unit(s) 112, and peripheral component device(s) 118 in order to produce a command for the cooling system. For example, power consumption measurements and component temperature may be received by power consumption detector module 302 and component temperature sensing module 304, respectively, from any or all of the components connected to bus 108. Additionally, ambient temperature readings may be received from a peripheral component device 118 by ambient temperature sensing module 306.

When any of the power consumption measurements, component temperature and ambient temperature has been received, cooling system control module 308 processes the received information and sends a signal to control the output of the cooling system of the computer components. For example, if power consumption measurements indicate an increase in power consumption by one or more of the components of the system, cooling system control module 308 may send a signal to increase the output of the cooling system. An increase in output may result in the activation of a cooling fan, or an increase in the fan speed of the cooling fan.

Cooling system control module 308 may adjust the output of the cooling system based on information received from any one of the power consumption detection module 302, component temperature sensing module 304, ambient temperature sensing module 306, or a combination of any two or all three modules. Furthermore, the information received from the modules may be measurements taken from any one or more of the components connected to bus 108. As discussed above, the components from which these measurements may be taken include but are not limited to system memory 104, processing unit(s) 112, and peripheral component device(s) 118.

In some aspects, the modules may be implemented in software (e.g., subroutines and code). The software implementation of the modules may operate on web browsers running on electronic system 100. In some aspects, some or all of the modules may be implemented in hardware (e.g., an Application Specific Integrated Circuit (ASIC), a Field Programmable Gate Array (FPGA), a Programmable Logic Device (PLD), a controller, a state machine, gated logic, discrete hardware components, or any other suitable devices) and/or a combination of both. Additional features and functions of these modules according to various aspects of the subject technology are further described in the present disclosure.

Figure 4:
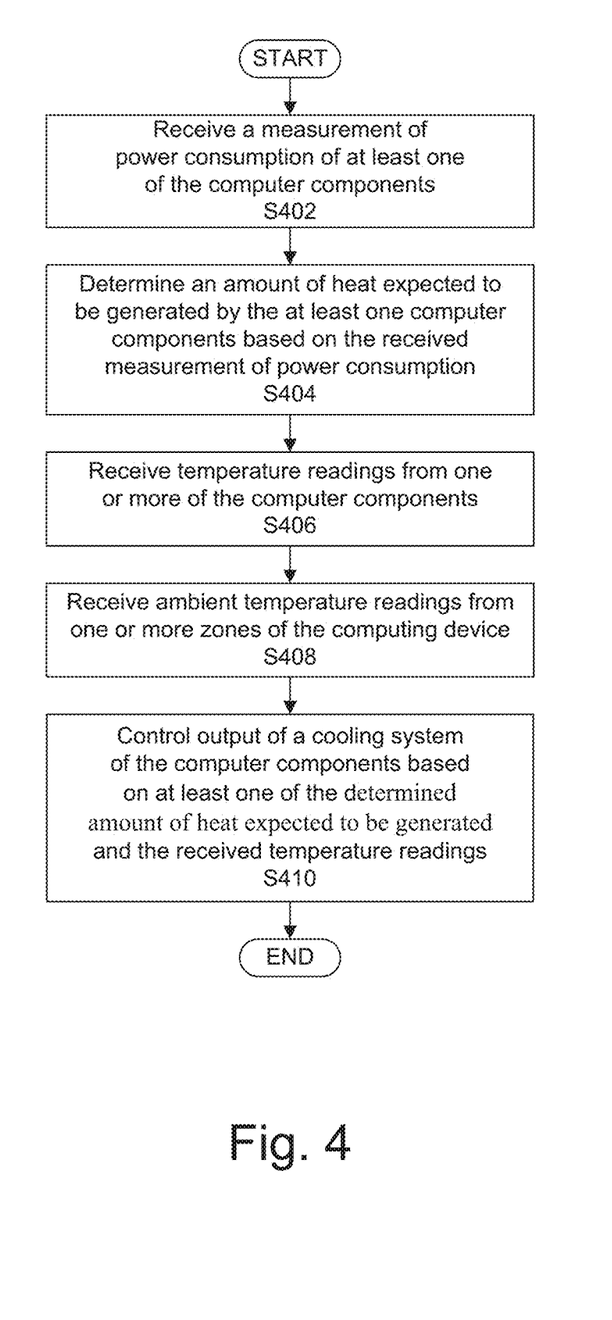
FIG. 4 illustrates an example method for controlling a computer cooling system.

FIG. 4 illustrates example method 400 for controlling a computer cooling system of computer components of a computing device. A measurement of power consumption of at least one of the computer components is received in S402, and an amount of heat expected to be generated by the at least one computer components is determined based on the received measurement of power consumption in S404. In some embodiments, temperature readings from one or more of the computer components may be received in S406, and ambient temperature readings from one or more zones of the computing device may be received in S408. At S410, an output of a cooling system of the computer components is controlled based on at least one of the received measurement of power consumption and the received temperature readings. For example, if the determined amount of heat expected to be generated indicates an increase in temperature at one or more of the computer components of the computing device, an output of the cooling system of the computer components may be controlled in such a fashion so as to increase the output of the cooling system. In some instances, fan speed used to generate forced airflow may be increased to improve the cooling. The control for the fan speed can be determined as fan RPM, a percentage of maximum RPM, or PWM.

Using component power (e.g., power from CPU, DIMM, attached drives, PCIe cards, etc.) to control the fan speed provides a means to accurately estimate the fan speeds required to cool a specified component to a specific target temperature. Component power may be read, measured, or calculated by a variety of methods. In some embodiments, an on-board power measurement is read via firmware. Firmware types include, but are not limited to, Baseboard Management Controllers (BMCs), basic input/output system (BIOS), chassis managers, Statistical Analysis System (SAS) expander firmware, and firmware for a variety of system components (DIMMs, hard disk/solid state drives, CPUs, PCI-e cards, etc.). In other embodiments, component power may be measured by external measurement devices including multi-meters and AC power analyzers. In some instances, component power may be calculated by mathematical derivation. For example, component power consumption may be derived from known component temperatures, environment temperatures and fan PWMs.

Figure 6:
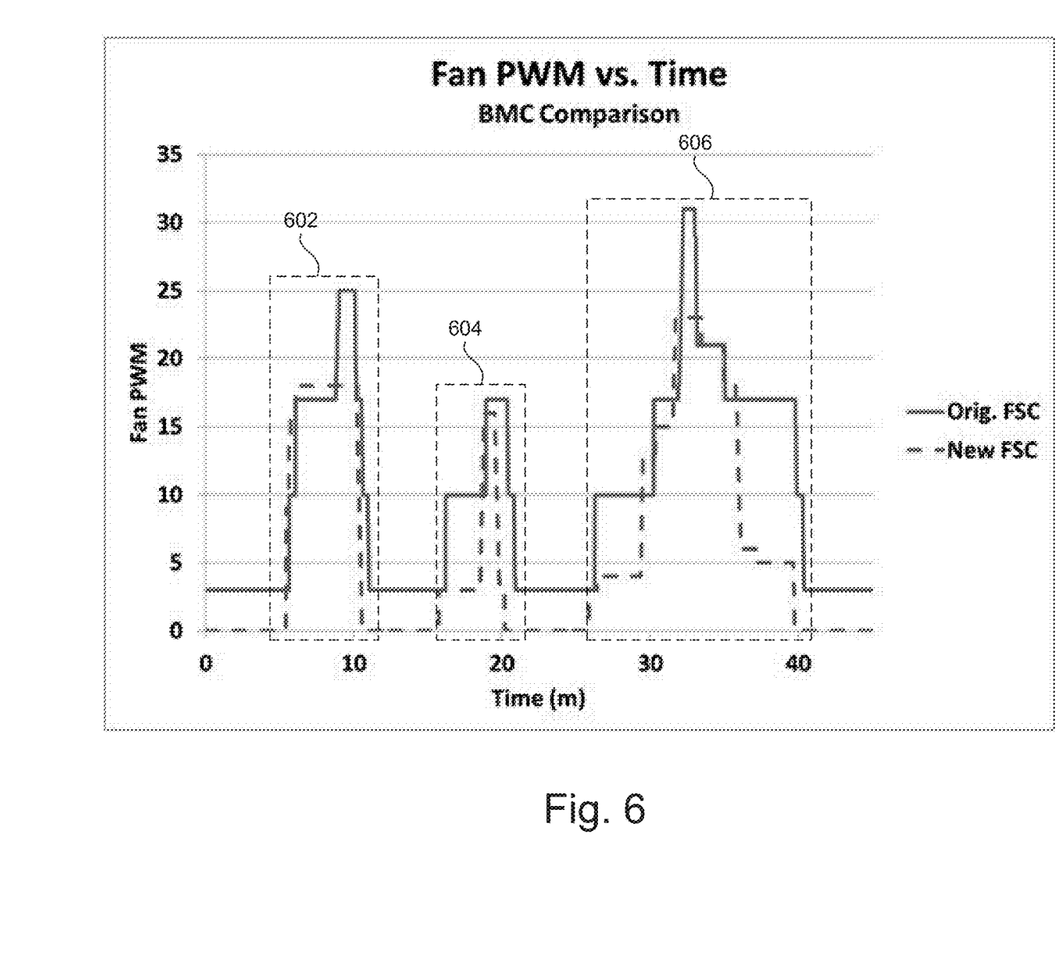
FIG. 6 provides a graph depicting the energy consumption of a conventional computer component cooling system versus that of a computer component cooling system that takes into account component power.

An increase in component power typically indicates an increase in processing and/or other functionality demands, and in turn, an increase in the heat generated. Such increases in heat generation typically lags behind measured increases in component power consumption since components tend to heat up gradually as processing demand increases. Thus, having power consumption measurements of computer components allows the computer cooling control system to predict potential increases in component temperature, and adjust fan speeds instantaneously in order to mitigate situations as soon as they arise, or even before they arise. Addressing heat issues in a timely fashion may also result in lower power requirements to maintain operating temperatures of components below a specified threshold. FIG. 6, as described in detail below, provides an illustration of the power consumption savings from the use of computer cooling system that bases calculations on component power.

In some embodiments, the output of a cooling system of the computer components may be controlled based additionally on the received temperature readings from one or more of the computer components, and/or the received ambient temperature readings. Component and ambient temperature readings, in addition to component power measurements, may provide additional means to accurately estimate the fan speeds required to cool a specified component to a specific target temperature. Actual component temperature, along with ambient temperature of the computing device, provide a snapshot of current temperature condition. When combined with component power consumption measurements, an accurate estimate of current and impending temperature conditions of the computing device may be made. Utilizing such information, the computer component cooling system may adequately and intelligently address cooling concerns by adjusting fan speeds accordingly.

In some embodiments, the computer component cooling system operates in multiple phases. While the following description provides for an exemplary three-phase operation, other types of operations including additional phases may also be used. In the three-phase operation system, a first phase (also known as the ambient phase) is characterized by a CPU having operating temperature below a predefined low threshold. In the first phase, CPU power measurements are used to estimate temperature of other downstream components. For example, power to downstream components may be derived from the CPU power consumption measurements. During the first phase, fan speed is determined by the component and ambient temperature.

The three-phase operation enters a second phase when the CPU temperature is moderate (e.g., above the predefined low threshold, but below a predefined high threshold). During this phase, the component power is monitored such that if there is a significant increase, the fan(s) may be quickly activated to address the impending rise in temperature as a result of the increased processing demands. The significance of the increase may be determined via the above-described correlation models. For example, the correlation model may indicate that when an X rise in component power is measured, a Y increase in component temperature is expected. If that Y value is greater than a predefined value and requires heat mitigating efforts, then the increase may be considered significant. During this phase, the fan(s) may be activated in advance of a detected rise in temperature such that the computer component cooling system does not have to play "catch up" with a potential rapid increase in temperature.

By the same logic, a reduction of power consumption, as measured at the component, may suggest an impending reduction in component temperature. Based on this information, the computer component cooling system may reduce the speed of the fan in anticipation of this reduction. Doing so helps conserve energy that would have otherwise been used to cool the component temperature father below the predefined threshold than necessary, thereby causing a suboptimal increase in the thermal margin.

In the third phase of the three-phase operation, the CPU temperature reading is above the predefined high threshold. During this phase, the CPU temperature is the only input required for controlling the fan speed. When the temperature is above the predefined high threshold, the computer component cooling system's objective is to reduce the temperature as quickly as possible. In order to do so, the fan speed may be maximized until the CPU temperature falls below the high threshold. If power consumption happens to be low, the fan still needs to operate at max level to reduce temperature readings as quickly as possible. If power consumption is high, there would be no additional measure to be taken, since the fan is already operating at max level. In other words, short of dropping the CPU temperature below the high threshold, it is inconsequential whether measurement of power consumption by the CPU is high/rising or low/falling.

In some embodiments, thermal benchmark tests may be used to simulate a variety of boundary conditions for computer components based on these measurements and/or temperature readings. Benchmark test data, in addition to data regression techniques, may be used to determine temperature correlations. For example, mathematical correlations based on component powers may be used to determine the airflow or fan speed required for all possible conditions. This correlation may include mathematical correlations to formulate models for component boundary conditions. Boundary conditions may include such metrics as local ambient temperatures, upstream heat dissipation, and localized airflow. Formulation of boundary conditions correlations can be dependent on airflow characteristics (i.e., fan speed) and/or explicit temperature/power readings from other components.

Mathematical correlations for estimation of component temperature may also be generated. These correlations may be dependent on component power consumption as well as calculated boundary conditions obtained from direct calculation (as described above) or input as an intermediate variable. Mathematical correlations may be used to determine airflow requirements for system components. For example, airflow requirements can be calculated according to operating temperature limits, component boundary conditions (actual or calculated), component temperature (actual or calculated), and component power consumption (actual or calculated). Additionally, airflow requirements for multiple computer components may be determined in parallel. This ensures that all critical component temperature remain below maximum operational temperature limits. FIGS. 5a-5e provide illustrative examples of how mathematical correlations are applied to determine control of the computer component cooling system.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term "software" is meant to include firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Figure 5A:
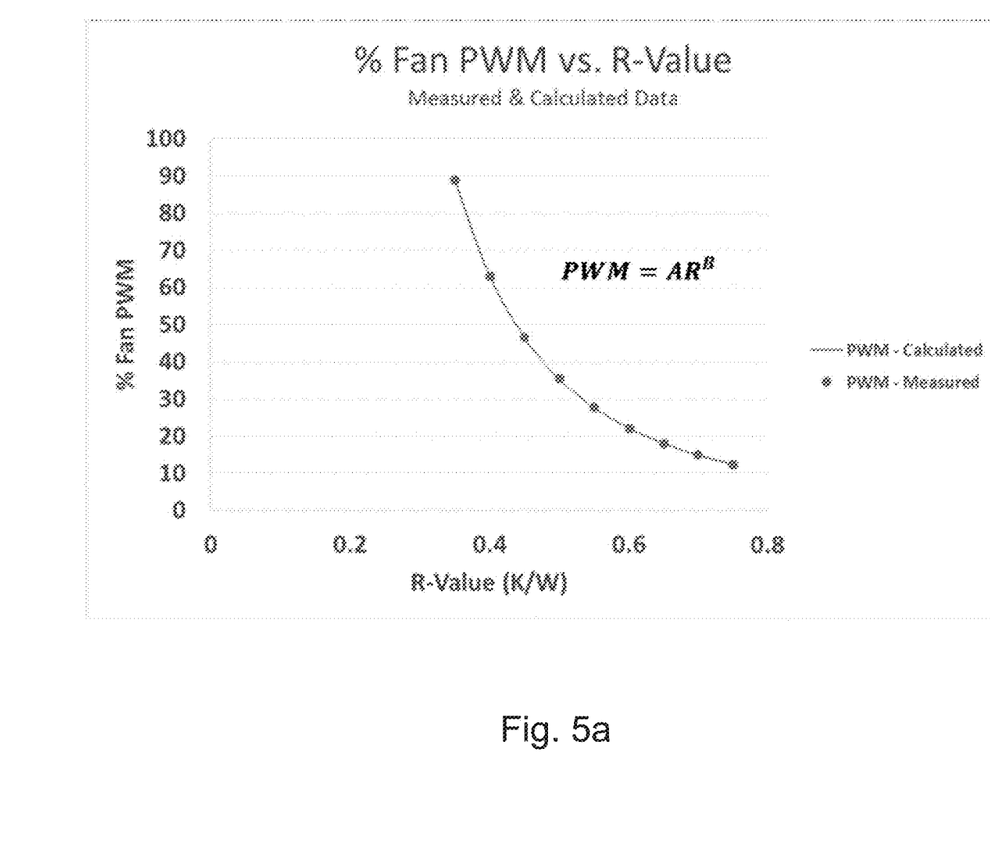
FIG. 5a provides a graph depicting a mathematical correlation between an intermediate variable to a fan pulse width modulation (PWM).

FIG. 5a provides a graph depicting the mathematical correlation between an intermediate variable, which depends on component power and other conditions, to a fan PWM, which indicates the airflow required. While the current example relates to a specific computer cooling control system, those of ordinary skill in the art will appreciate that other mathematical correlations may be used to correspond to alternative computer cooling control systems.

The current example utilizes the correlation function represented by the following equation:

$$PWM = A\left(\frac{T_{targ} - T_{amb}}{Q}\right)^B \qquad \text{Equation 1}$$

Equation 1 is a power equation that estimates the relationship between PWM and R-Value for a specific computer cooling control system.

While the graph depicted in FIG. 5a (representing Equation 1) indicates a strong correlation for the specific computer cooling control system, Equation 1 may not provide as strong a correlation for other computer cooling control systems. Instead, other computer cooling control systems may require different formulations, which can include polynomial (Equation 2), exponential (Equation 3), and a variety of other curve-fit methods.

$$PWM = A + BR + CR^2 + \ldots \quad \text{Equation 2}$$

$$PWM = Ae^{Bx} \quad \text{Equation 3}$$

Figure 5B:
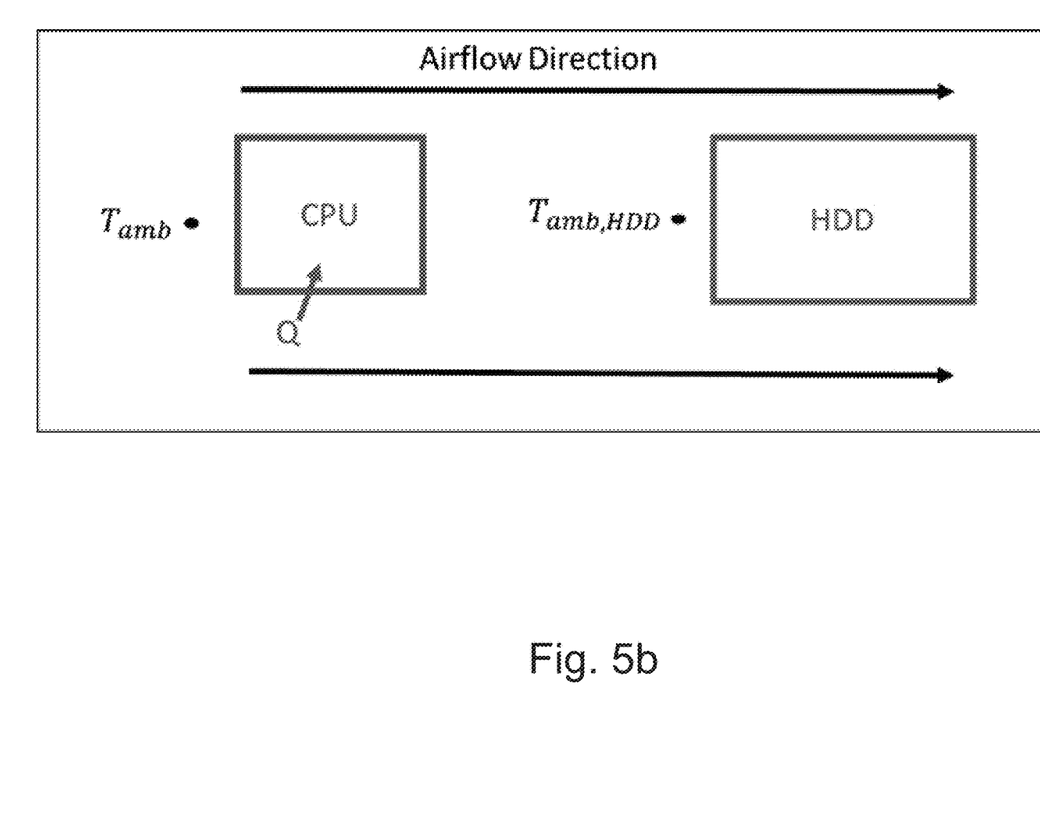
FIG. 5b illustrates a configuration of computer components for which boundary condition estimation for a hard disk drive may be calculated.
Figure 5C:
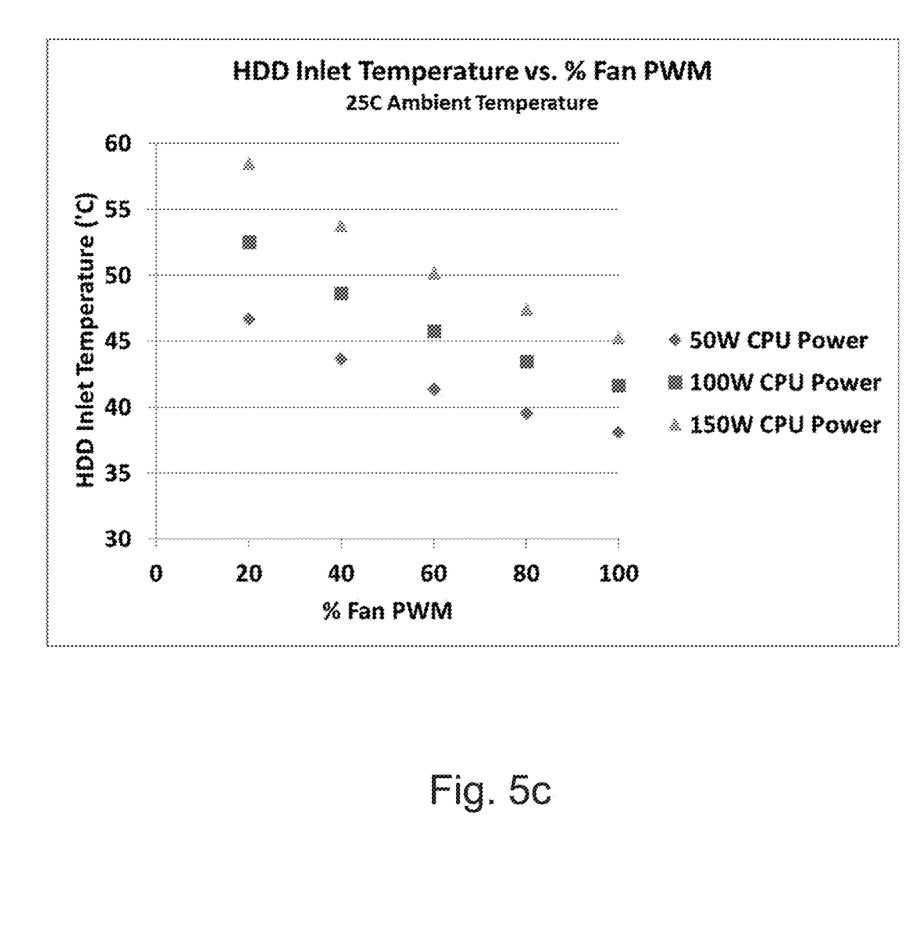
FIGS. 5c and 5d provide graphs illustrating results of benchmark thermal testing.
Figure 5D:
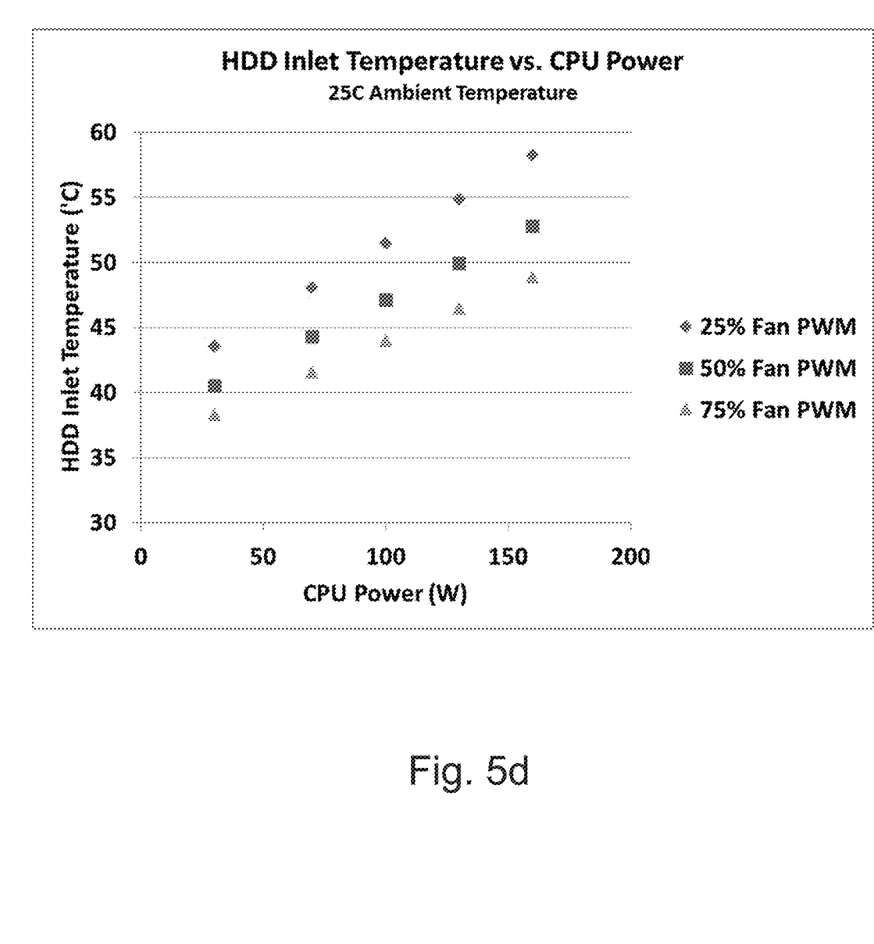

FIG. 5b illustrates a configuration of computer components for which boundary condition estimation (E-value) for a hard disk drive (HDD) may be calculated. In the configuration represented by FIG. 5b, HDD inlet temperature ($T_{amb, HDD}$) is determined in terms of ambient temperature ($T_{amb}$), CPU power (Q), and fan PWM (PWM). FIGS. 5c and 5d provide graphs illustrating results of benchmark thermal testing. The graph indicates that HDD inlet temperature is proportional to CPU power (shown in FIG. 5c), and inversely proportional to % Fan PWM (shown in FIG. 5d). By using linear approximations of the dependence on CPU power and % Fan PWM, Equation 4 may be determined.

$$T_{amb,HDD} = \frac{a + bQ}{PWM + c} + T_{amb} \quad \text{Equation 4}$$

In Equation 4, values represented by a, b and c are unknown constants that depend on the underlying computer cooling control system. In other words, a, b and c may vary depending on factors such as the configuration of computer components. These values may be calculated using thermal benchmark data in conjunction with linear and/or non-linear system solvers.

In addition to estimating HDD inlet temperature, a reverse form of Equation 4 may be used to calculate the PWM required to maintain the HDD inlet temperature at a specific value, shown as Equation 5 below.

$$PWM = \frac{a + bQ}{T_{targ} - T_{amb}} - c \quad \text{Equation 5}$$

Figure 5E:
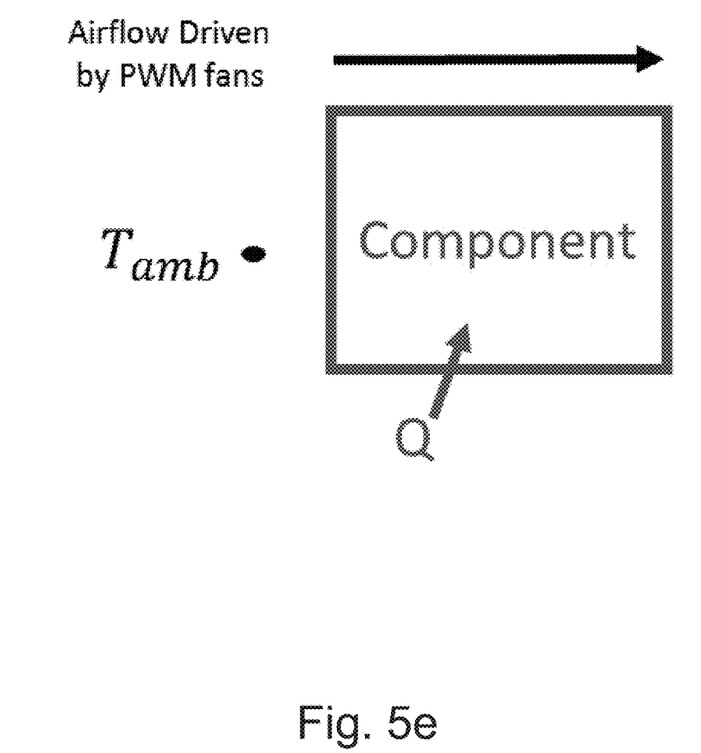
FIG. 5e illustrates a configuration of computer components for which component temperature may be estimated.

FIG. 5e illustrates a configuration of computer components for which component temperature (R-value) may be estimated. In determining the component temperature ($T_{comp}$) with respect to component power (Q), fan PWM (PWM), and ambient temperature ($T_{amb}$), thermal resistance R-value may be introduced as follows.

$$R = \frac{T_{comp} - T_{amb}}{Q} \quad \text{Equation 6}$$

Using thermal benchmark data, Equation 7 below provides a correlation of PWM with respect to R-value. Note that A and B are unknown constants that correspond to the underlying physical system.

$$PWM = AR^B \quad \text{Equation 7}$$

A and B may be calculated using thermal benchmark data in conjunction with linear regression techniques. After determining the values of A and B, Equation 8 below may be used to calculate the PWM required to cool a component to a pre-defined target temperature ($T_{targ}$).

$$PWM = A \left( \frac{T_{targ} - T_{amb}}{Q} \right)^B \quad \text{Equation 8}$$

FIG. 6 provides a graph depicting the energy consumption of a conventional computer component cooling system versus that of a computer component cooling system that takes into account component power. By controlling the cooling fan(s) based on component power, significant power savings are realized. In the graph provided by FIG. 6, original FSC power consumption is shown by the solid line and new FSC (i.e., FSC that's determined based on component power) is shown by the dotted line. In short, the power savings is represented by the net area between the original and new FSC lines.

In the graph, three different increases in fan PWM are recorded, each representing a change in temperature event 602, 604 and 606. Each of these three increases represent an increase in fan speed as a result of some predicted (in the case of the new FSC) or actual (in the case of both FSC) temperature increase. As shown, the fan PWM are at a low PWM until about the 5 minute mark along the x-axis where first temperature event 602 occurs. At this time, both fan PWMs increase to a value of approximately 17 in response to an increase in component temperature. At the 8 minute mark, however, the original FSC steps up fan PWM again, to a value of 25, as a result of a continued increase in component temperature. The new FSC, however, maintains a PWM value of 17. The new FSC is able to do so because a measurement in component power indicated a drop in component power consumption, and thus a drop in component temperature was predicted. As a result, the new FSC did not increase fan speed, but instead maintained a constant fan speed. Soon after the 10 minute mark, both the original and new FSCs drop their respective PWM values to the minimum, as the component has been adequately cooled. In this first temperature event 602, a power consumption savings can be observed during the 8 to 10 minute timeframe, where the original FSC raised fan PWM while the new FSC maintained a steady PWM. The resulting cooling effect of the two different approaches, however, was the same.

A second temperature event 604 can be observed at the 15 minute mark. At this interval, both original and new FSC increase fan PWMs at the same time; however, the magnitude of the new FSC is smaller than that of the original FSC, as the new FSC predicts a lesser increase based on component power measurements than what the temperature read by the original FSC indicates. At approximately the 17 minute mark, however, the new FSC receives a component power measurement that suggests that the component temperature is expected to rise. As such, the new FSC steps the fan PWM up to a level approximately equal to that which is being used by the original FSC. The original FSC, however, detects a bump a temperature at the same time and steps up the fan PWM once again, but increases the fan PWM to a level higher than that of the new FSC. At the 20 minute mark, the component temperatures begin to drop and the new FSC again has the additional power consumption information. Thus, the new FSC is able to more quickly reduce fan speeds as the new FSC predicts a sharp drop in temperature based on the power consumption information. The original FSC, on the other hand, can only base fan PWMs on component temperature measured at that time. Thus, the fans are directed to maintain a higher level of PWM than necessary to get the component temperature down to an allowable level. In this second temperature event 604, a power consumption savings can be observed during the 15 to 18 minute timeframe, where the original FSC raised fan PWM more aggressively than the new FSC, and again at the 19 to 20 minute time frame, where the new FSC reduced fan PWM earlier than that of the old FSC.

A third temperature event 606 can be observed starting at the 26 minute mark. At this interval, both original and new FSC increase fan PWMs at the same time. Again, the magnitude of the new FSC is smaller than that of the original FSC, as the new FSC predicts a lesser increase based on component power measurements than what the temperature read by the original FSC indicates. At approximately the 30 minute mark, however, the new FSC receives a component power measurement that suggests that the component temperature is expected to rise. As such, the new FSC steps the fan PWM up to a level higher than that which is being used by the original FSC. The original FSC, however, detects a bump a temperature shortly thereafter and steps up the fan PWM once again, but has to increase the fan PWM to a level higher than that of the new FSC in order to catch up with cooling the component temperature. At the 31 minute mark, the original FSC, in response to further increases in component temperature, makes another significant step up in fan PWM. The new FSC, however, increases fan PWM by a lesser amount since the new FSC again has the component power consumption measurements to estimate component temperature, and this estimate is lower than that which was measured by the original FSC.

Once the component temperatures begin to drop, the new FSC again has the additional power consumption information, and thus is able to more aggressively reduce fan speeds as the new FSC predicts a sharp drop in temperature based on the power consumption information. The original FSC, on the other hand, can only base fan PWMs on component temperature measured at that time. Thus, the fans are directed to maintain a higher level of PWM than necessary to get the component temperature down to an allowable level. In this third temperature event 604, a power consumption savings can be observed during the 26 to 30 minute timeframe, where again the original FSC raised fan PWM more aggressively than the new FSC. At the 36 to 40 minute time frame, the new FSC reduces power consumption by reducing fan PWM earlier and more aggressively than that of the old FSC.

The cumulative effect of being able to more efficiently cool the computer components is represented in Table 1 below.

TABLE 1

| % CPU Usage | 0% | 50% | 100% | Total |
|---|---|---|---|---|
| Fan       Original | 21.1 | 24.3 | 33.6 | 26.3 |
| Power    New | 12.5 | 16.3 | 24.9 | 16.5 |
| % Power Saved | 40.8% | 32.9% | 25.9% | 37.2% |

As shown, the new FSC controls the fan PWM to use less power across the range of CPU usage. In total, an estimated 37.2% of power is saved by utilizing component power as a metric for determining fan speeds of a computer component cooling control system. The power savings in Table 1 provide a numerical representation of the power consumption savings indicated by the area between the original FSC and the new FSC fan PWM line shown in FIG. 6.

While the above discussion describes in detail computer component cooling by operating a fan in a forced air cooling systems, the same concepts may be applied to liquid cooling systems using water pumps as well. For example, the pumps in a liquid cooling system may be modulated based on measurements in component power consumption as well as component and ambient temperature readings. In other words, the intelligent controls that estimate potential temperature increases and decreases to determine fan speed can be equally applied to water pumps their control of flow of liquid through the liquid cooling system.

The functions described above related to the electronic system can be implemented in digital electronic circuitry, in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some implementations are performed by one or more integrated circuits, such as application specific integrated circuits (ASICs) or field programmable gate arrays (FPGAs). In some implementations, such integrated circuits execute instructions that are stored on the circuit itself.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network and a wide area network, an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., an HTML page) to a client device (e.g., for purposes of displaying data to and receiving user input from a user interacting with the client device). Data generated at the client device (e.g., a result of the user interaction) can be received from the client device at the server.

It is understood that any specific order or hierarchy of steps in the processes disclosed is an illustration of approaches. Based upon design preferences, it is understood that the specific order or hierarchy of steps in the processes may be rearranged, or that all illustrated steps be performed. Some of the steps may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. A method for controlling cooling of computer components of a computing device, the method comprising:
   receiving, by a processor, a measurement of power consumption of a first component of a plurality of computer components;
   determining, by the processor, an amount of heat expected to be generated by the first component of the plurality of computer components based on the received measurement of power consumption;
   receiving, by the processor, temperature readings from one or more of the plurality of computer components and ambient temperature readings from one or more zones of the computing device;
   determining, by the processor, an inlet temperature of a coolant at the first component, based on the ambient temperature readings, a value of a flow of the coolant, and a determination of an amount of heat expected to be generated by a portion of the plurality of computer components upstream within a path of flow of the coolant, the path being common to the first component and the portion of the plurality of computer components and the coolant being one of water and air; and
   controlling, by the processor, an output of a cooling system of the computer components based on the inlet temperature at the first component, and at least one of the determined amount of heat expected to be generated by the first component of the plurality of computer components and the received temperature readings.

2. The method of claim 1 wherein the plurality of computer components includes one or more of a central processing unit (CPU), all in-line memory module, a storage drive, and a peripheral component interconnect express (PCIe) card.

3. The method of claim 1, further comprising:
   calculating one or more thermal margins based on the received temperature reading from the one or more of the plurality of computer components and corresponding one or more predefined maximum operating temperatures; and
   wherein controlling the output of the cooling system of the computer components is further based on the received temperature readings from one or more of the computer components and the calculated one or more thermal margins.

4. The method of claim 1, wherein controlling the output of the cooling system of the computer components is further based on the received ambient temperature readings from the one or more zones of the computing device.

5. The method of claim 1, wherein the power consumption of the first computer component is read by one of firmware, an external measurement device, and a mathematical derivation.

6. The method of claim 1, wherein the cooling system is a forced air system, and wherein controlling the output of a cooling system of the computer components based on the determined amount of heat expected to be generated includes:
  utilizing mathematical correlations to determine airflow requirements for different conditions based on the received measurement of power consumption and the estimated power consumptions, and
  adjusting fan speeds to meet the determined airflow requirements.

7. The method of claim 1, wherein the cooling system is a liquid cooled system, and wherein controlling the output of a cooling system of the computer components based on received measurement of power consumption includes:
  utilizing mathematical correlations to determine water flow requirements for different conditions based on the received measurement of power consumption, and
  adjusting pump speeds to meet the determined water flow requirements.

8. A system for controlling cooling of computer components of a computing device, the system comprising:
  a processor-based application executed on a computer and configured to:
  receive a measurement of power consumption of a first component of a plurality of computer components;
  determine an amount of heat expected to be generated by the first component of the plurality of computer components based on the received measurement of power consumption;
  receiving, by the processor, temperature readings from one or more of the plurality of computer components and ambient temperature readings from one or more zones of the computing device;
  determine an inlet temperature of a coolant at the first component, based on the ambient temperature readings, a value of a flow of the coolant, and a determination of an amount of heat expected to be generated by a portion of the plurality of computer components upstream within a path of flow of the coolant, the path being common to the first component and the portion of the plurality of computer components and the coolant being one of water and air; and
  control an output of a cooling system of the computer components based on the inlet temperature at the first component, and at least one of the determined amount of heat expected to be generated by the first component of the plurality of computer components and the received temperature readings.

9. The system of claim 8 wherein the plurality of computer components includes one or more of a central processing unit (CPU), an in-line memory module, a storage drive, and a peripheral component interconnect express (PCIe) card.

10. The system of claim 8 wherein the processor-based application is further configured to:
  calculate one or more thermal margins based on the received temperature reading from the one or more of the plurality of computer components and corresponding one or more predefined maximum operating temperatures; and
  wherein controlling the output of the cooling system of the computer components is further based on the received temperature readings from the one or more computer components and the calculated one or more thermal margins.

11. The system of claim 8 wherein controlling the output of the cooling system of the computer components is further based on the received ambient temperature readings from the one or more zones of the computing device.

12. The system of claim 8 wherein the power consumption of the first computer component is read by one of firmware, an external measurement device, and a mathematical derivation.

13. The system of claim 8, wherein the cooling system is a forced air system, and wherein controlling the output of a cooling system of the computer components based on the determined amount of heat expected to be generated includes:
  utilizing mathematical correlations to determine airflow requirements for different conditions based on the received measurement of power consumption and the estimated power consumptions, and
  adjusting fan speeds to meet the determined airflow requirements.

14. The system of claim 8, wherein the cooling system is a liquid cooled system, and wherein controlling the output of a cooling system of the computer components based on received measurement of power consumption includes:
  utilizing mathematical correlations to determine water flow requirements for different conditions based on the received measurement of power consumption, and
  adjusting pump speeds to meet the determined water flow requirements.

15. A computer program product, comprising a non-transitory computer-readable medium having a computer-readable program code embodied therein to be executed by one or more processors, the program code including instructions to:
  receive a measurement of power consumption of a first component of a plurality of computer components;
  determine an amount of heat expected to be generated by the first component of the plurality of computer components based on the received measurement of power consumption;
  receive temperature readings from one or more of the plurality of computer components and ambient temperature readings from one or more zones of the computing device;
  determine, by the processor, an inlet temperature of a coolant at the first component, based on the ambient temperature readings, a value of a flow of the coolant, and a determination of an amount of heat expected to be generated by a portion of the plurality of computer components upstream within a path of flow of the coolant, the path being common to the first component and the portion of the plurality of computer components and the coolant being one of water and air; and
  control an output of a cooling system of the computer components based on the inlet temperature at the first component, and at least one of the determined amount of heat expected to be generated by the first component of the plurality of computer components and the received temperature readings.

16. The computer program product of claim 15 wherein the plurality of computer components includes one or more of a central processing unit (CPU), an in-line memory module, a storage drive, and a peripheral component interconnect express (PCIe) card.

17. The computer program product of claim 15 wherein the program code further includes instructions to:
  calculate one or more thermal margins based on the received temperature reading from the one or more of the plurality of computer components and corresponding one or more predefined maximum operating temperatures; and wherein controlling the output of the cooling system of the computer components is further based on the received temperature readings from one or more of the computer components and the calculated one or more thermal margins.

18. The computer program product of claim 15 wherein controlling the output of the cooling system of the computer components is further based on the received ambient temperature readings from the one or more zones of the computing device.

19. The computer program product of claim 15 wherein the power consumption of the first computer component is read by one of firmware, an external measurement device, and a mathematical derivation.

20. The computer program product of claim 15, wherein the cooling system is a forced air system, and wherein controlling the output of a cooling system of the computer components based on the determined amount of heat expected to be generated includes:

utilizing mathematical correlations to determine airflow requirements for different conditions based on the received measurement of power consumption and the estimated power consumptions, and adjusting fan speeds to meet the determined airflow requirements.

* * * * *